(12) United States Patent
Yeh et al.

(10) Patent No.: US 9,881,927 B2
(45) Date of Patent: Jan. 30, 2018

(54) CMOS-COMPATIBLE POLYCIDE FUSE STRUCTURE AND METHOD OF FABRICATING SAME

(71) Applicant: Intel Corporation, Santa Clara, CA (US)

(72) Inventors: Jeng-Ya D. Yeh, Portland, OR (US); Chia-Hong Jan, Portland, OR (US); Walid M. Hafez, Portland, OR (US); Joodong Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/780,222

(22) PCT Filed: Jun. 25, 2013

(86) PCT No.: PCT/US2013/047626
§ 371 (c)(1),
(2) Date: Sep. 25, 2015

(87) PCT Pub. No.: WO2014/209285
PCT Pub. Date: Dec. 31, 2014

(65) Prior Publication Data
US 2016/0056162 A1    Feb. 25, 2016

(51) Int. Cl.
| H01L 29/78 | (2006.01) |
| H01L 27/092 | (2006.01) |
| H01L 27/112 | (2006.01) |
| H01L 29/66 | (2006.01) |
| H01L 23/525 | (2006.01) |

(Continued)

(52) U.S. Cl.
CPC .......... *H01L 27/11206* (2013.01); *H01L 21/823431* (2013.01); *H01L 23/5256* (2013.01);

(Continued)

(58) Field of Classification Search
CPC ............ H01L 21/28518; H01L 23/525; H01L 23/5256; H01L 21/823431;

(Continued)

(56) References Cited

U.S. PATENT DOCUMENTS

| 6,208,549 | B1 | 3/2001 | Rao et al. |
| 7,994,603 | B2 * | 8/2011 | Wang .............. H01L 21/823425 257/500 |

(Continued)

FOREIGN PATENT DOCUMENTS

| JP | 2002237524 | 8/2002 |
| TW | 201133635 | 10/2011 |
| TW | 201316494 | 4/2013 |

OTHER PUBLICATIONS

International Search Report and Written Opinion for PCT Patent Application No. PCT/US2013/047626 dated Apr. 18, 2014, 11 pgs.

(Continued)

*Primary Examiner* — Yu Chen
(74) *Attorney, Agent, or Firm* — Schwabe, Williamson & Wyatt P.C.

(57) ABSTRACT

CMOS-compatible polycide fuse structures and methods of fabricating CMOS-compatible polycide fuse structures are described. In an example, a semiconductor structure includes a substrate. A polycide fuse structure is disposed above the substrate and includes silicon and a metal. A metal oxide semiconductor (MOS) transistor structure is disposed above the substrate and includes a metal gate electrode.

6 Claims, 18 Drawing Sheets

(51) Int. Cl.
*H01L 21/8234* (2006.01)
*H01L 27/088* (2006.01)

(52) U.S. Cl.
CPC ...... *H01L 27/0886* (2013.01); *H01L 27/0924* (2013.01); *H01L 29/66795* (2013.01); *H01L 29/78* (2013.01); *H01L 29/785* (2013.01); *H01L 29/66545* (2013.01); *H01L 2924/0002* (2013.01)

(58) Field of Classification Search
CPC ....... H01L 21/76889; H01L 21/823443; H01L 27/0886; H01L 27/0924; H01L 29/4933; H01L 29/66545; H01L 29/1037; H01L 29/66795; H01L 29/785; H01L 23/62
See application file for complete search history.

(56) References Cited

U.S. PATENT DOCUMENTS

| | | | |
|---|---|---|---|
| 2006/0208274 A1* | 9/2006 | Wu | H01L 21/84 257/132 |
| 2007/0111403 A1 | 5/2007 | Jiang et al. | |
| 2008/0157201 A1 | 7/2008 | Marshall | |
| 2009/0243032 A1 | 10/2009 | Chen | |
| 2009/0283840 A1 | 11/2009 | Coolbaugh et al. | |
| 2010/0133649 A1* | 6/2010 | Lin | H01L 23/5256 257/529 |
| 2010/0301417 A1* | 12/2010 | Cheng | H01L 27/0629 257/355 |
| 2012/0129312 A1* | 5/2012 | Utomo | H01L 23/5256 438/381 |
| 2013/0187206 A1* | 7/2013 | Mor | H01L 29/66628 257/288 |

OTHER PUBLICATIONS

International Preliminary Report on Patentability, Application No. PCT/US2013/047626, dated Dec. 29, 2015, 7 pages.
First Office Action for Taiwan Application No. 103,120,699, dated Aug. 20, 2015, 16 pages.
Second Office Action for Taiwanese Application No. 103,120,699, dated Apr. 21, 2016, 17 pages.

* cited by examiner

CMOS-COMPATIBLE POLYCIDE FUSE STRUCTURE AND METHOD OF FABRICATING SAME

TECHNICAL FIELD

Embodiments of the invention are in the field of semiconductor devices and processing and, in particular, CMOS-compatible polycide fuse structures and methods of fabricating CMOS-compatible polycide fuse structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, high-k and metal gate processing has been introduced into front end of line (FEOL) processing schemes to enable further scaling. Additionally, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on including passive features among active devices have increased, e.g., for system-on-chip (SoC) based architectures.

DESCRIPTION OF THE EMBODIMENTS

Figure 1A:
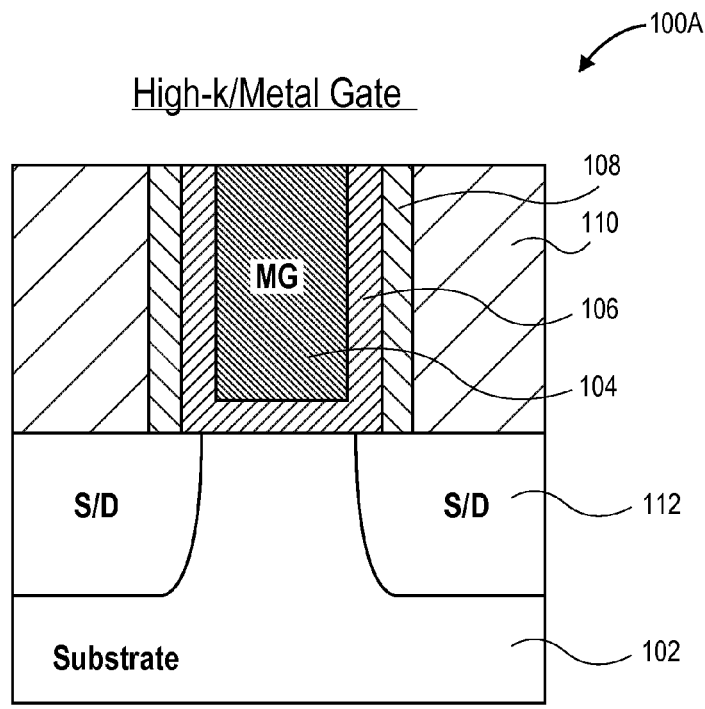
FIG. 1A illustrates a cross-sectional view of a MOS-FET transistor having a metal gate/high-k material stack, in accordance with an embodiment of the present invention.

CMOS-compatible polycide fuse structures and methods of fabricating CMOS-compatible polycide fuse structures are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to polycide fuse structures and manufacturing methods for high-K metal gate technology. Embodiments may include one or more of complimentary metal oxide semiconductor (CMOS) devices, high-K gate dielectric and/or metal gate processing schemes, one time programmable (OTP) fuses, polysilicide (polycide) fuse structures and process technology, and programmable fuses.

Generally, approaches described herein involve process integration schemes that enable fabrication of a polycide fuse element and high-k/metal gate CMOS technology integration. More specifically, in an embodiment, a lithography and etch patterning process is used to recess a dummy polysilicon structure prior to replacement gate processing in order to effectively bury a polysilicon gate underneath an inter-layer dielectric oxide film. The preserved polysilicon gate is then silicided and used as a one time programmable fuse structure. Embodiments described herein may enable an alternative of fuse element architecture for future technology nodes. Furthermore, embodiments described herein provide options beyond standard metal fusing that can be directly integratable with high-k and metal gate based CMOS transistors.

To provide context, gate electrodes were initially formed from metal (e.g., aluminum). However, for many technology nodes, a Metal-Oxide-Semiconductor Field Effect Transistor (MOSFET) had included a gate electrode that was fabricated from polysilicon so as to permit ion implantation (e.g., to customize doping to N- or P-type in the same circuit) and silicidation (to reduce contact resistance). Consequently, a fuse associated with the MOSFET in a circuit was also fabricated with silicided polysilicon. A so-called "gate-first" process sequence was universally practiced so as to permit blanket deposition of the polysilicon, plasma etch-defined gate lengths, lightly-doped tip regions, dielectric sidewall spacers, and self-aligned source/drain (i.e., to the gate electrode).

As dimensions of the MOSFET continued to be scaled down in recent technology nodes, polysilicon depletion became an increasingly severe problem. As a result, gate electrodes are now being formed from metal again. However, gate electrodes are typically no longer formed strictly from aluminum. In order to achieve desired work functions, the gate electrodes are now usually formed from a transition metal, an alloy of transition metals, or a transition metal nitride. However, adoption of the metal gate also provided advantages to an alternative so-called "gate-last" process. One implementation of the gate-last process involved a so-called "replacement gate" process which allowed use of different metals for the N-FET and P-FET in the circuit. When the material in the gate electrode was changed from polysilicon back to metal, back end of line (BEOL) metal fuses became the standard fuse structures. Due to technology scaling and back-end resistance increase, however, metal fuses are proving to be difficult for maintaining the resistance differential between the fuse element and parasitic routing resistance. On the other hand, a polycide fuse is on the same level of the program transistor and typically does not suffer from the low resistance differential issue, potentially providing an improved fuse technology.

Furthermore, embodiments described herein may be compatible with planar type devices and architectures, but may also be compatible with non-planar architectures. Thus, in accordance with one or more embodiments of the present invention, polycide fuse structure formation methods on non-planar high-k/metal gate technologies are also described.

As described in greater detail below in association the Figures, one or more embodiments described herein are directed to process integration schemes that enable polysilicon preservation in certain regions during high-k and metal gate CMOS technology fabrication. The polysilicon is preserved for later fabrication of a fuse element, e.g., which is patterned during a poly patterning process. Lithography processing may be performed to enable the polysilicon preservation portion of the integration scheme. In one such embodiment, a poly line for ultimate application as a polycide fuse element is exposed while the other poly gate regions are covered by photoresist. Dry etch processing can subsequently be performed, during which the poly fuse element is etched and recessed. In one such embodiment, a differential poly thickness between the fuse element and the surrounding standard poly gate structures is achieved in the etch and recess process. Following the patterning process, a polysilicon silicidation process may be performed in order to fabricate the polycide fuse element. A dummy gate and gate replacement process may then be used to fabricate high-K and metal gate based transistors in the standard gate regions. Then, following a metal gate fill and polish process, contact formation may be performed to provide contact landing on the polycide fuse element. The above described processes are integratable with the CMOS technology, with eth addition of a poly gate recess in fuse regions of the substrate.

Figure 1B:
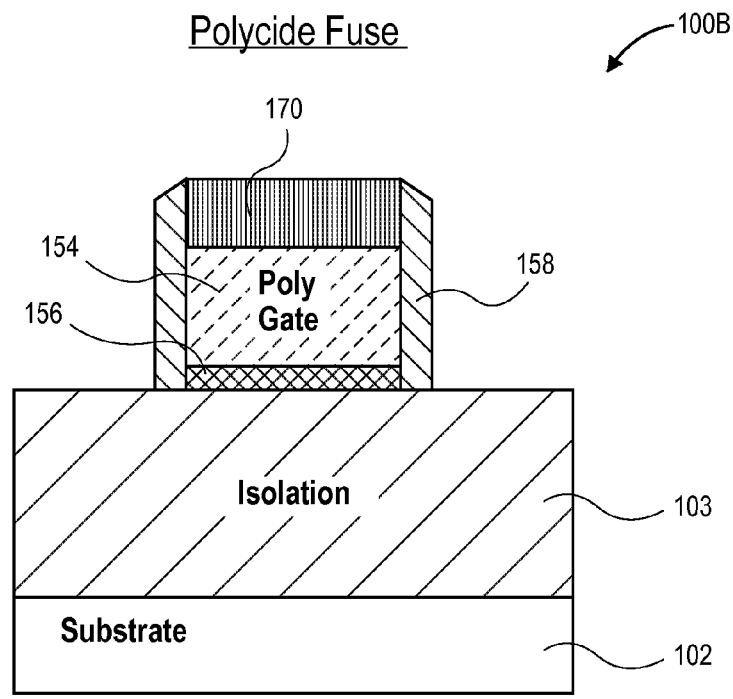
FIG. 1B illustrates a cross-sectional view of a CMOS-compatible polycide fuse structure, in accordance with an embodiment of the present invention.

As an example, of a CMOS-compatible polycide fuse structure, FIG. 1A illustrates a cross-sectional view of a MOS-FET transistor having a metal gate/high-k material stack, in accordance with an embodiment of the present invention. FIG. 1B illustrates a cross-sectional view of a CMOS-compatible polycide fuse structure, in accordance with an embodiment of the present invention. It is to be understood that the structures of FIGS. 1A and 1B may be fabricated on a common substrate and, thus, the polycide fuse structure of FIG. 1B is compatible with the CMOS high-k metal gate based device of FIG. 1A.

Referring to FIG. 1A, a MOS-FET transistor 100A is formed in and above a substrate 102, such as a bulk single crystalline substrate. A gate stack includes a metal gate (MG) electrode 104 and high-k gate dielectric layer 106 disposed above the substrate 102. Spacers 108 are formed on the sidewalls of the gate stack, and an inter-layer dielectric layer 110 is formed on either side of the spacers 108. Source and drain regions 112 are disposed in the substrate 102, on either side of the gate stack.

Referring to FIG. 1B, a polycide fuse structure 100B is formed above an isolation region 103 of the substrate 102. The polycide fuse structure 100B includes polysilicon "gate" material 154, which may be disposed above a dielectric layer 156. A metal silicide layer 170 is disposed on the polysilicon material 154. Spacers 158 may also be included, as depicted in FIG. 1B.

FIGS. 2A-2I illustrate cross-sectional views representing various operations in a method of fabricating a polycide fuse structure, in accordance with an embodiment of the present invention.

Figure 2A:
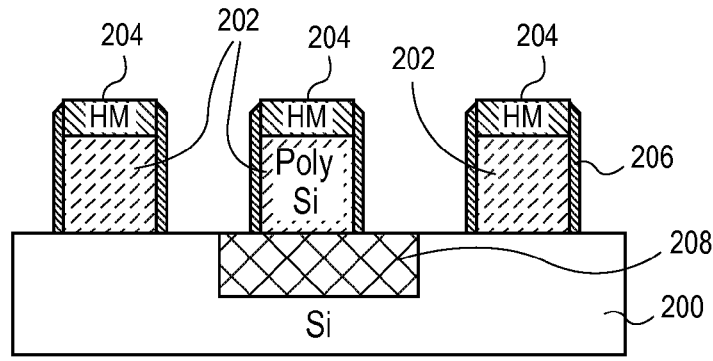
FIGS. 2A-2I illustrate cross-sectional views representing various operations in a method of fabricating a polycide fuse structure, in accordance with an embodiment of the present invention.
Figure 2B:
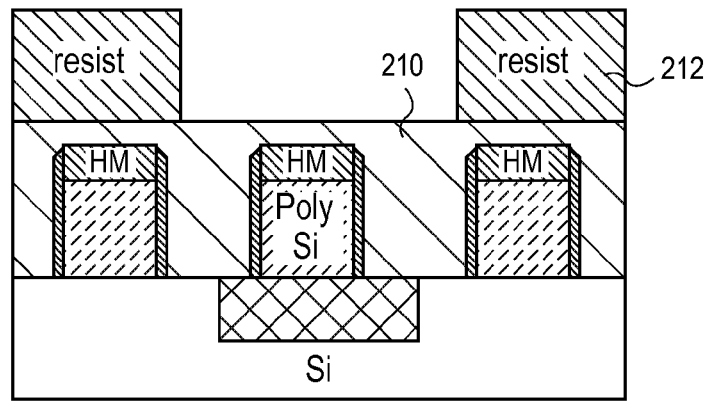
Figure 2C:
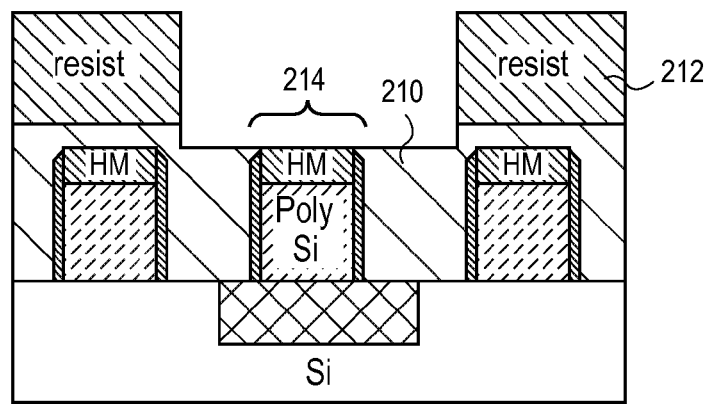
Figure 2D:
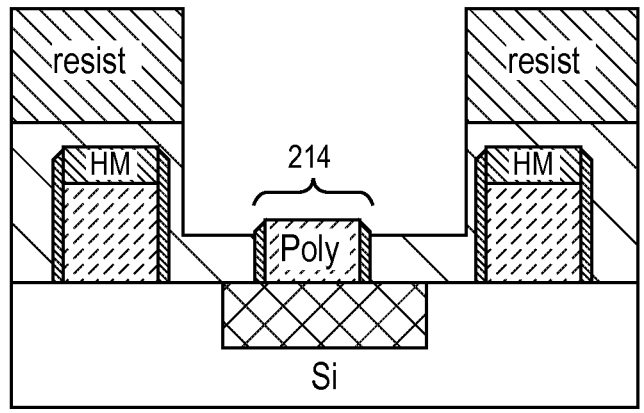
Figure 2E:
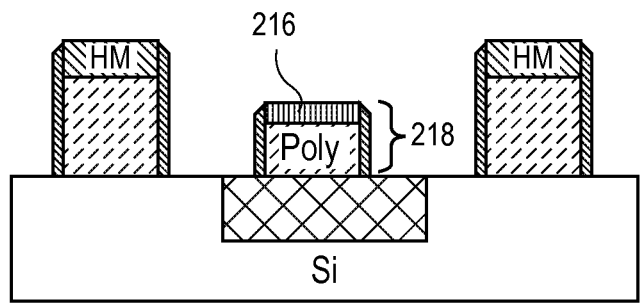
Figure 2F:
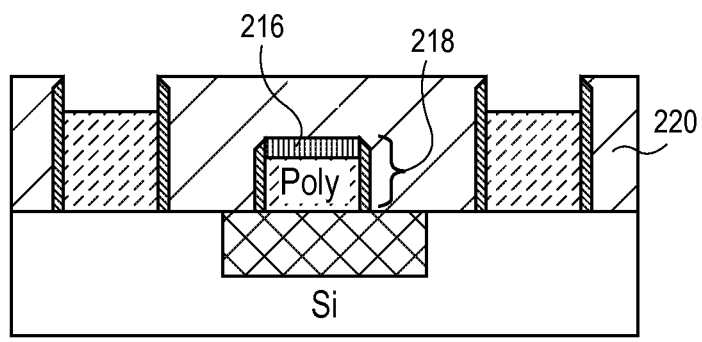
Figure 2G:
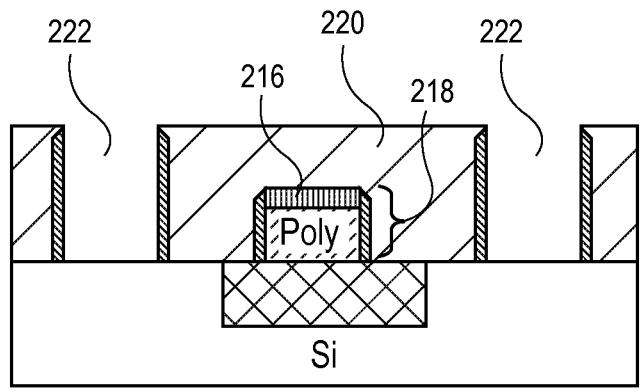
Figure 2H:
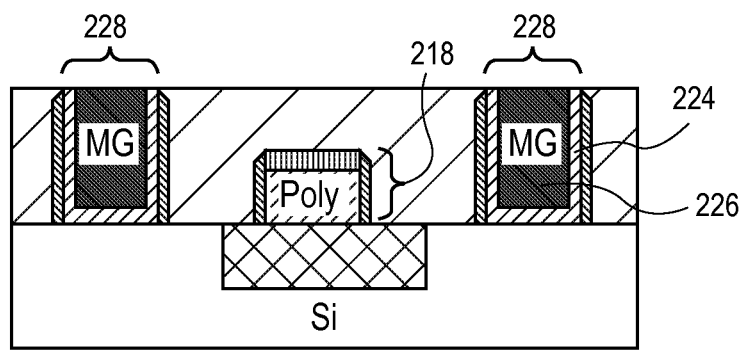
Figure 2I:
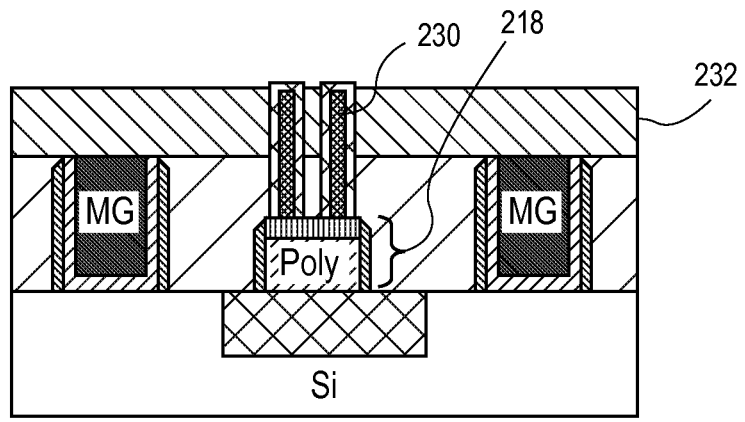

Referring to FIG. 2A, polycrystalline silicon lines 202 are patterned above a substrate 200, such as a single crystalline silicon substrate. The polycrystalline silicon lines 202 may include a hardmask (HM) 204 and/or spacers 206, as depicted in FIG. 2A. Although not shown, an insulating layer may be disposed between the substrate 202 and the polycrystalline silicon lines 202. One or more of the lines may be fabricated on an isolation region 208. Such a region can be formed with deposited oxide films such as by chemical vapor deposition (CVD), high density plasma deposition (HDP), or spin on dielectrics. An anti-reflective coating layer 210 and patterned photoresist layer 212 is then formed (which may involve a resist freeze operation) on the structure of FIG. 1A, as depicted in FIG. 2B. A polycrystalline silicon line intended for polycide fuse formation is exposed by the patterned photoresist layer 212. Referring to FIG. 2C, the anti-reflective coating layer 210 is recessed, e.g., by an etch process, to expose the polycrystalline silicon line 214 through the anti-reflective coating layer 210. The hardmask layer and upper spacer portions are then removed to expose the polysilicon of the polycrystalline silicon line 214, as depicted in FIG. 2D. Referring to FIG. 2E, a metal deposition/anneal or metal implant/anneal process is performed on the polysilicon of the polycrystalline silicon line 214 to provide a metal silicide layer 216. The resulting structure is a polycide fuse structure 218. As is also depicted in FIG. 2E, resist and anti-reflective coating layers may also be removed. An inter-layer dielectric layer 220, formed in a similar method as 208 (CVD, HDP, spin on dielectrics) is then formed above the resulting structures, as depicted in FIG. 2F. The inter-layer dielectric layer 220 to expose hardmasks of the remaining polycrystalline silicon lines, which may ultimately be removed, as depicted in FIG. 2F. However, the polycide fuse structure 218 is protected from the exposing process since it is recessed lower than the adjacent polycrystalline silicon structures. Referring to FIG. 2G, polycrystalline silicon lines are removed in a replacement gate process to provide trenches 222. Subsequently, a high-k gate dielectric layer 224 and metal gate electrode 226 is formed in trenches 222 to form transistor structures 228, as depicted in FIG. 2H. Referring to FIG. 2I, contacts 230 are made to the polycide fuse structure 218, e.g., through a dielectric layer 232.

As described throughout, in an embodiment, a material stack for a polycide fuse structure fabricated in parallel with CMOS transistor devices is composed of a lower polycrystalline silicon layer and an upper metal silicide layer formed from the reaction of, e.g., Cobalt (Co) or Nickel (Ni) with the polycrystalline silicon layer. In one embodiment, the material stack for a polycide fuse structure is not blown, and never is, leaving a polycrystalline silicon layer and upper metal silicide layer to remain. In another embodiment, the material stack for a polycide fuse structure is ultimately blown (e.g., form a current resulting from applying a voltage to the structure), leaving a mixture of silicon and metal to remain. That is, the blown fuse may not have a discernible polycrystalline silicon layer and upper metal silicide layer. In an embodiment, the polycrystalline silicon has a grain size of approximately 20 nanometers.

As described throughout, in an embodiment, a gate dielectric layer for the CMOS transistor devices fabricated in parallel with a polycide fuse structure is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

As described throughout, in an embodiment, a gate dielectric layer for the CMOS transistor devices fabricated in parallel with a polycide fuse structure is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In another aspect, a non-planar polycide fuse structure may be included as an embedded polycide fuse structure with a non-planar architecture. In an embodiment, reference to a non-planar polycide fuse structure is used herein to describe a polycide fuse structure having a polysilicon/silicide layer formed over one or more fins protruding from a substrate. As an example, FIG. 3A illustrates a top angled view and a cross-sectional view of a polycide fuse structure for a non-planar semiconductor device architecture, in accordance with an embodiment of the present invention.

Figure 3A:
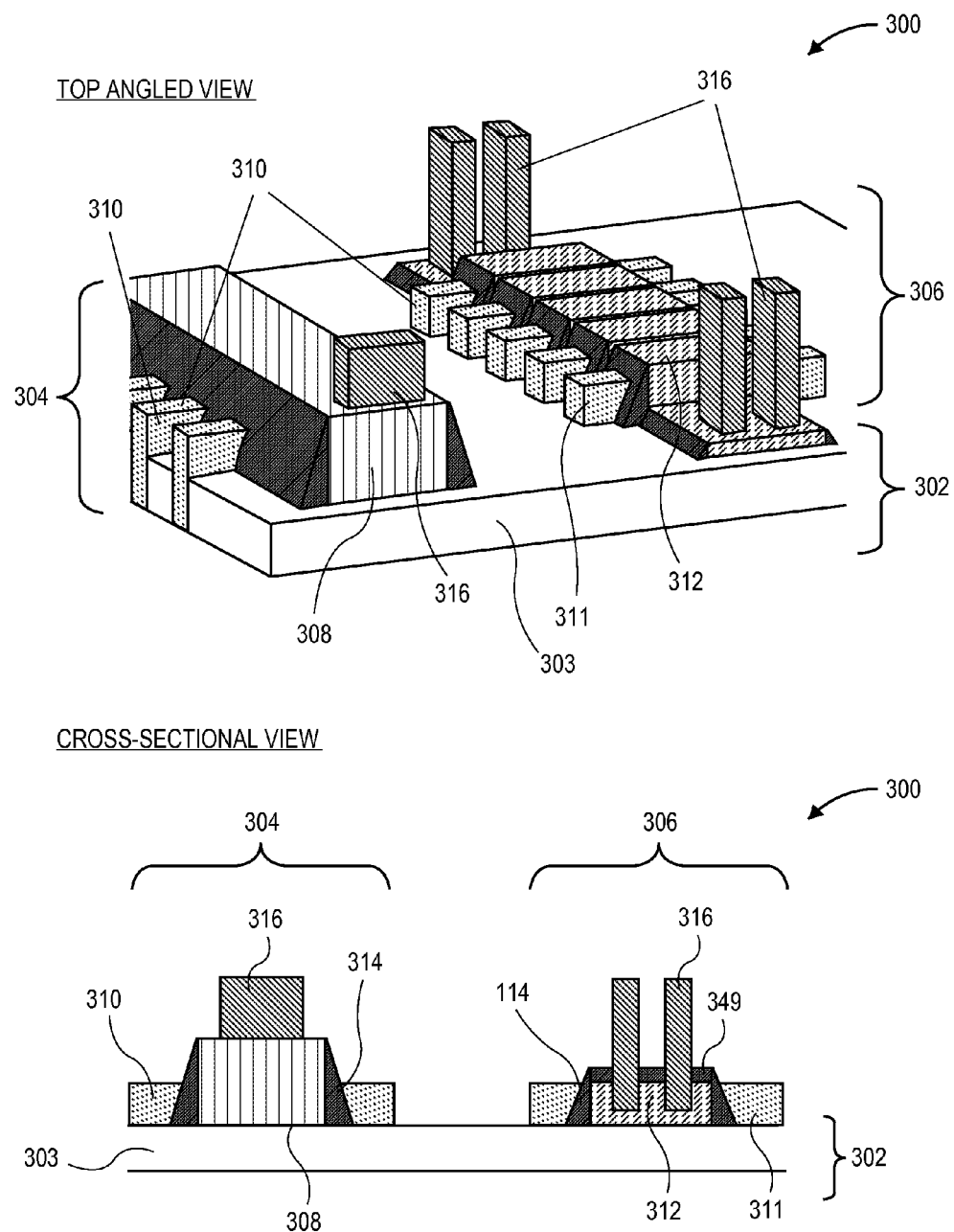
FIG. 3A illustrates a top angled view and a cross-sectional view of a polycide fuse structure for a non-planar semiconductor device architecture, in accordance with an embodiment of the present invention.

Referring to both views of FIG. 3A, a semiconductor structure 300 includes a substrate 302 (only partially shown) having a non-planar device 304 and a non-planar polycide fuse structure 306 formed on an isolation layer 303. Non-planar device 304 includes a gate stack 308, e.g., a metal gate/high-k gate dielectric gate stack. The gate stack 308 is formed over a first plurality of fins 310. Non-planar polycide fuse structure 306 includes a non-planar polysilicon layer 312, which includes a silicide layer 349 as shown in the cross-sectional view, formed over a second plurality of fins 311. Both devices include spacers 314 and contacts 316. In an embodiment, the polysilicon layer 312 and overlying silicide layer 349 are formed conformal with the plurality of fins 311. In one such embodiment, a dielectric layer (not shown) isolates the polysilicon layer 312 from the plurality of fins 311.

In an embodiment, the first and second pluralities of fins 310 and 311 are formed from a bulk substrate 302, as depicted in FIG. 3A. In one such example, bulk substrate 302 and, hence, the pluralities of fins 310 and 311 may be composed of a semiconductor material that can withstand a manufacturing process and in which charge can migrate. In an embodiment, bulk substrate 302 is composed of a crystalline silicon, silicon/germanium or germanium layer doped with a charge carrier, such as but not limited to phosphorus, arsenic, boron or a combination thereof. In one embodiment, the concentration of silicon atoms in bulk substrate 302 is greater than 97%. In another embodiment, bulk substrate 302 is composed of an epitaxial layer grown atop a distinct crystalline substrate, e.g. a silicon epitaxial layer grown atop a boron-doped bulk silicon mono-crystalline substrate. Bulk substrate 302 may alternatively be composed of a group III-V material. In an embodiment, bulk substrate 302 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 302 is composed of a III-V material and the charge-carrier dopant impurity atoms are ones such as, but not limited to, carbon, silicon, germanium, oxygen, sulfur, selenium or tellurium. In an embodiment, bulk substrate 302 and, hence, the pluralities of fins 310 and 311 is undoped or only lightly doped. In an embodiment, at least a portion of the pluralities of fins 310 and 311 is strained.

Alternatively, the substrate 302 includes an upper epitaxial layer and a lower bulk portion, either of which may be composed of a single crystal of a material which may include, but is not limited to, silicon, germanium, silicon-germanium or a III-V compound semiconductor material. An intervening insulator layer composed of a material which may include, but is not limited to, silicon dioxide, silicon nitride or silicon oxy-nitride may be disposed between the upper epitaxial layer and the lower bulk portion.

Isolation layer 303 may be composed of a material suitable to ultimately electrically isolate, or contribute to the isolation of, a permanent gate structure from an underlying bulk substrate. For example, in one embodiment, the isolation dielectric layer 303 is composed of a dielectric material such as, but not limited to, silicon dioxide, silicon oxy-nitride, silicon nitride, or carbon-doped silicon nitride. It is to be understood that a global layer may be formed and then recessed to ultimately expose the active portions of the pluralities of fins 310 and 311.

In an embodiment, the non-planar device 304 is a non-planar device such as, but not limited to, a fin-FET or a tri-gate device. In such an embodiment, a semiconducting channel region of the non-planar device 304 is composed of or is formed in a three-dimensional body. In one such embodiment, the gate stack 308 surrounds at least a top surface and a pair of sidewalls of the three-dimensional body, as depicted in FIG. 3A. In another embodiment, at least the channel region is made to be a discrete three-dimensional body, such as in a gate-all-around device. In one such embodiment, the gate electrode stack 308 completely surrounds the channel region.

As mentioned above, in an embodiment, the semiconductor devices 304 includes a gate stack 308 at least partially surrounding a portion of the non-planar device 304. In one such embodiment, gate stack 308 includes a gate dielectric layer and a gate electrode layer (not shown individually). In an embodiment, the gate electrode of gate stack 308 is composed of a metal gate and the gate dielectric layer is composed of a high-K material.

In an embodiment, the spacers 314 are composed of an insulative dielectric material such as, but not limited to, silicon dioxide, silicon oxy-nitride or silicon nitride. In an embodiment, contacts 316 are fabricated from a metal species. The metal species may be a pure metal, such as tungsten, nickel or cobalt, or may be an alloy such as a metal-metal alloy or a metal-semiconductor alloy (e.g., such as a silicide material).

In another aspect, a planar polycide fuse structure may be included with a non-planar architecture. In an embodiment, reference to a planar polycide fuse structure is used herein to describe a polycide fuse structure having a polysilicon/silicide layer formed adjacent to, but not over, one or more fins protruding from a substrate. As an example, FIG. 3B illustrates a cross-sectional view of a polycide fuse structure for a non-planar semiconductor device architecture, in accordance with another embodiment of the present invention.

Figure 3B:
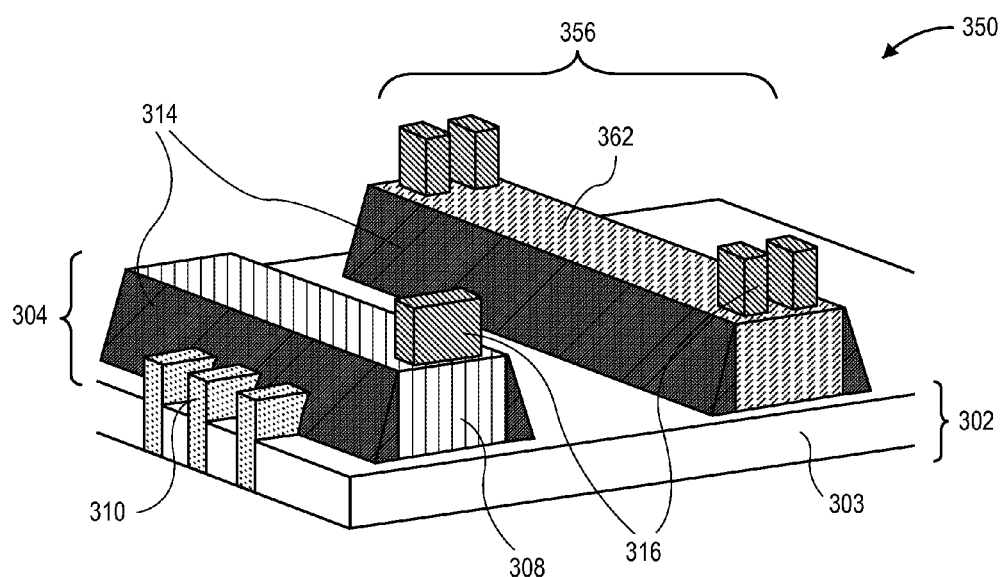
FIG. 3B illustrates a cross-sectional view of a polycide fuse structure for a non-planar semiconductor device architecture, in accordance with another embodiment of the present invention.

Referring to FIG. 3B, a semiconductor structure 350 includes a substrate 302 (only partially shown) having a non-planar device 304 and a planar polycide fuse structure 356 formed on an isolation layer 303. Non-planar device 304 includes a gate stack 108, e.g., a metal gate/high-k gate dielectric gate stack. The gate stack 308 is formed over a plurality of fins 310. Planar polycide fuse structure 356 includes a planar polysilicon layer 362 formed over isolation layer 303. The planar polysilicon layer 362 includes an upper silicide layer (not shown). Both devices include spacers 114 and contacts 116. The other features of FIG. 3B may be composed of materials similar to those described for FIG. 3A. For example, the plurality of fins 310 is, in one embodiment, formed from a bulk substrate 302, as depicted in FIG. 3B.

Figure 4A:
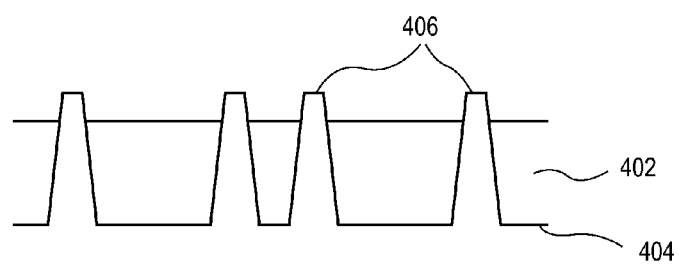
FIGS. 4A-4K illustrate cross-sectional views representing various operations in a method of fabricating a polycide fuse structure for a non-planar semiconductor device architecture, in accordance with an embodiment of the present invention.
Figure 4B:
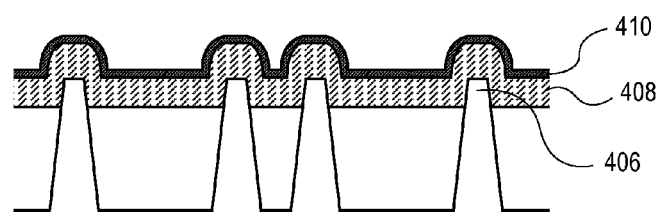
Figure 4C:
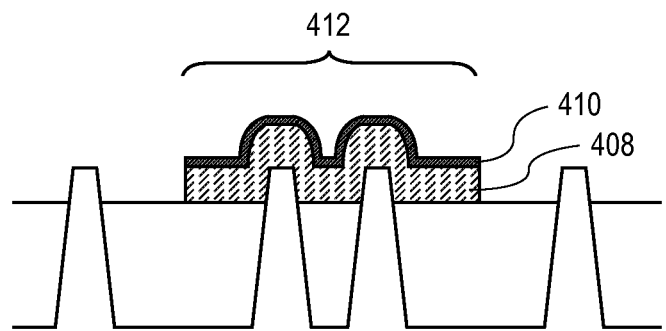
Figure 4D:
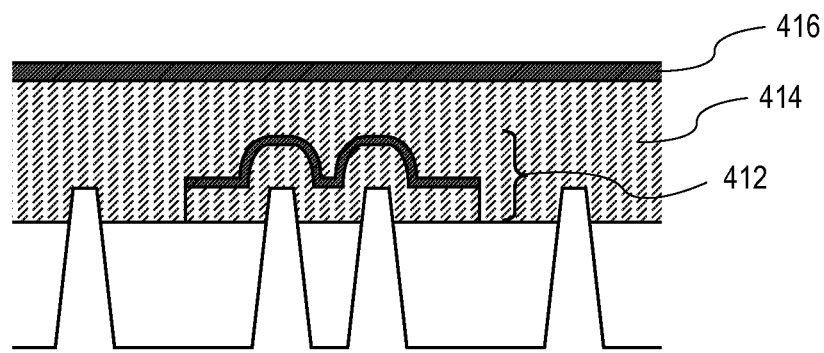
Figure 4E:
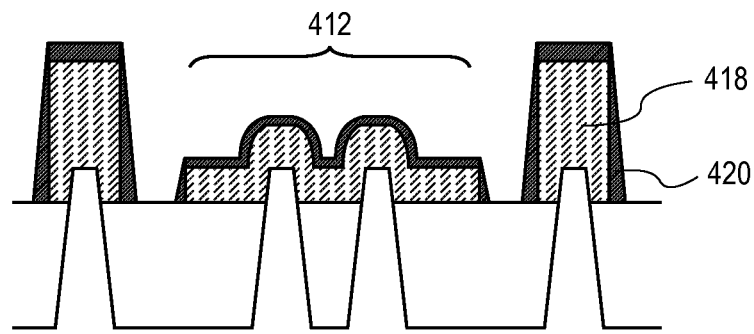
Figure 4F:
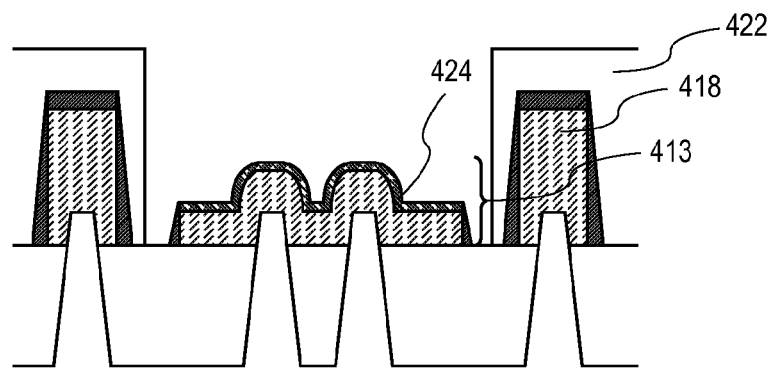
Figure 4G:
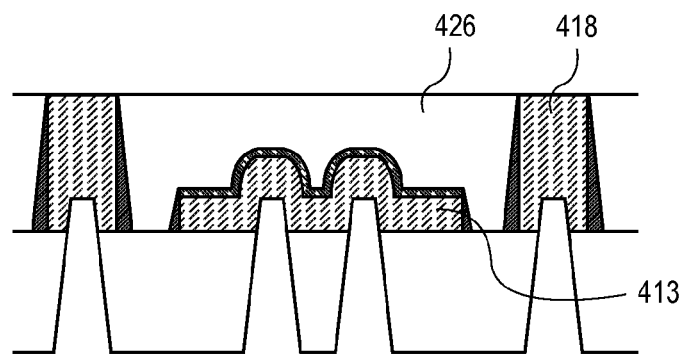
Figure 4H:
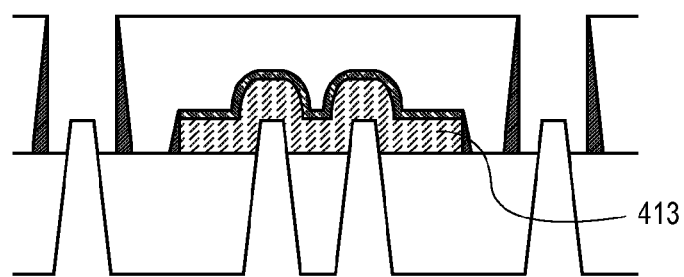
Figure 4I:
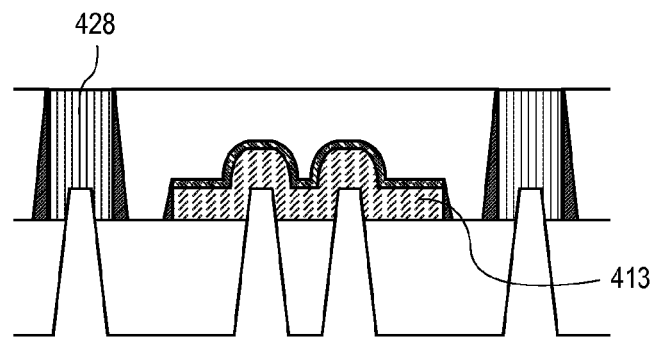
Figure 4J:
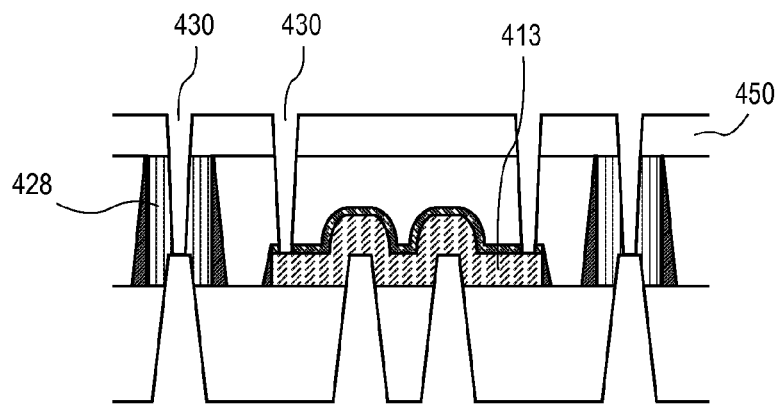
Figure 4K:
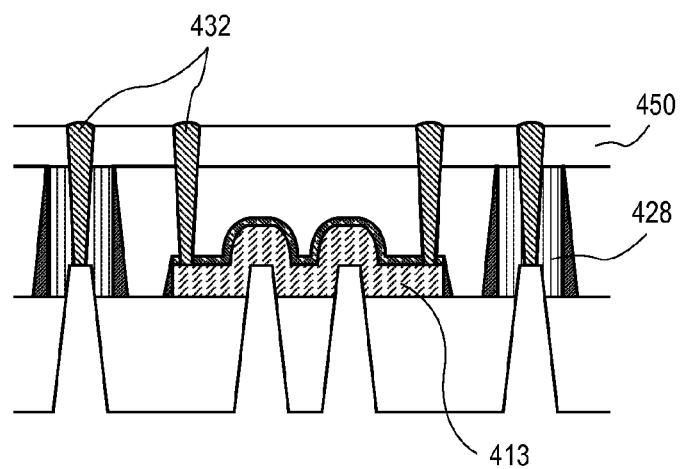

In a first non-planar fabrication approach, FIGS. 4A-4K illustrate cross-sectional views representing various operations in a method of fabricating a polycide fuse structure for a non-planar semiconductor device architecture, in accordance with an embodiment of the present invention. Referring to FIG. 4A, an isolation layer 402 is formed on a patterned bulk substrate 404 and recessed to leave a plurality of fins 406 exposed. A first layer of polysilicon 408 and a silicon nitride hardmask 410 is then formed conformal with the plurality of fins 406, as depicted in FIG. 4B. Although not depicted, an insulating layer may first be formed on fins 406 to ultimately insulate polysilicon layer 408 from the fin material. Referring to FIG. 4C, a patterning process, e.g., a lithography and etch process, of the first layer of polysilicon 408 and the silicon nitride hardmask 410 is performed to provide a polycide fuse precursor structure 412. A second layer of polysilicon 414 is then formed above the polycide fuse precursor structure 412. The second layer of polysilicon 414 is planarized, e.g., by a chemical mechanical polishing process, and a second hardmask layer 416 is formed thereon, as depicted in FIG. 4D. Referring to FIG. 4E, a patterning process, e.g., a lithography and etch process, of the second layer of polysilicon 414 and the second hardmask 416 is performed to provide dummy gate structures 418, which may include spacers 420. The dummy gate structure 418 may then be masked by mask 422, and hardmask 410 is removed from the polycide fuse precursor structure 412. Subsequently, a metal deposition/anneal or metal implant/anneal process is performed on the hardmask-free polycide fuse precursor structure 412 to provide a metal silicide layer 424. The resulting structure is a polycide fuse structure 413, as depicted in FIG. 4F. Referring to FIG. 4G, mask 422 is removed and an inter-layer dielectric layer 426 (e.g., silicon oxide) is formed over the dummy gate structures 418 and the polycide fuse structure 413. The inter-layer dielectric layer 426 is planarized to expose the polysilicon of the dummy gate structure 418, but to retain polycide fuse structure 413 as un-exposed. The polysilicon of the dummy gate structures 418 is then removed, but the polycide fuse structure 413 is retained, as depicted in FIG. 4H. Referring to FIG. 4I, permanent gate electrodes 428, e.g., metal gate electrodes (with, possibly, high-k gate dielectric layers), are formed. Additional inter-layer dielectric material 450 is formed and contact openings 430 are then formed to expose both the permanent gate electrodes 428 and the polycide fuse structure 413 for electrical connection, as depicted in FIG. 4J. Referring to FIG. 4K, contacts 432 are formed, e.g., by tungsten metal fill and polishing. The permanent gate structures 428 may be gate structures for a tri-gate device, while the structure 413 is a polycide fuse structure. The above approach may be referred to as a dual polysilicon deposition approach.

Figure 5A:
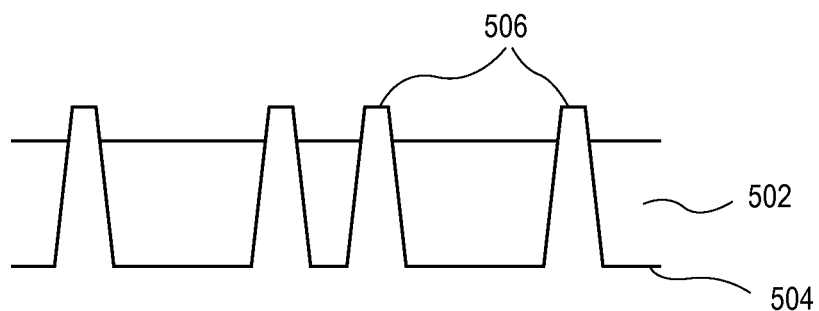
FIGS. 5A-5K illustrate cross-sectional views representing various operations in another method of fabricating a polycide fuse structure for a non-planar semiconductor device architecture, in accordance with an embodiment of the present invention.
Figure 5B:
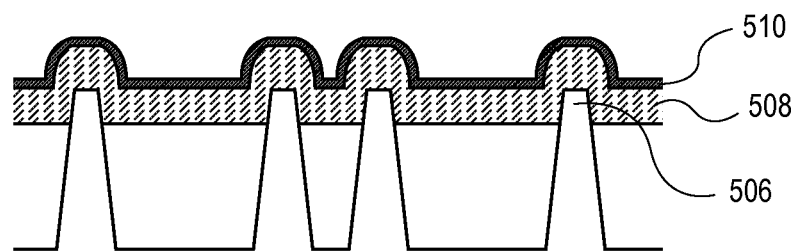
Figure 5C:
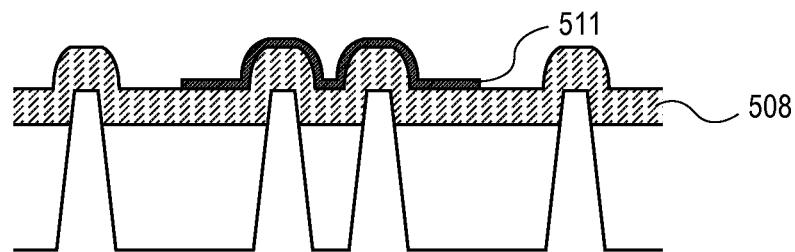
Figure 5D:
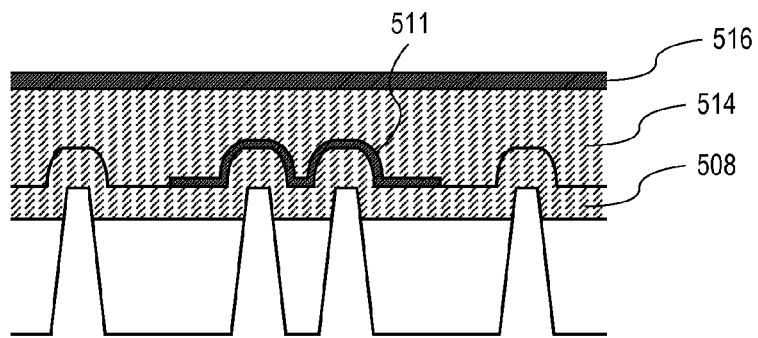
Figure 5E:
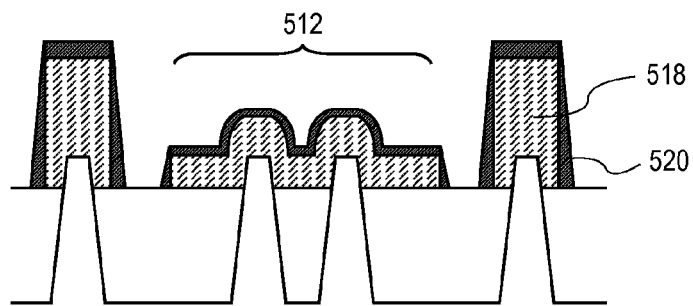
Figure 5F:
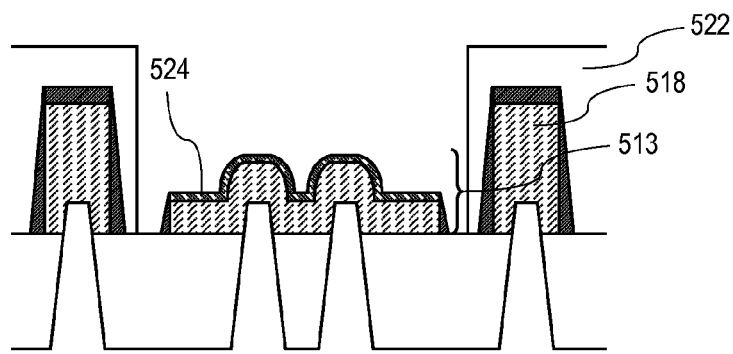
Figure 5G:
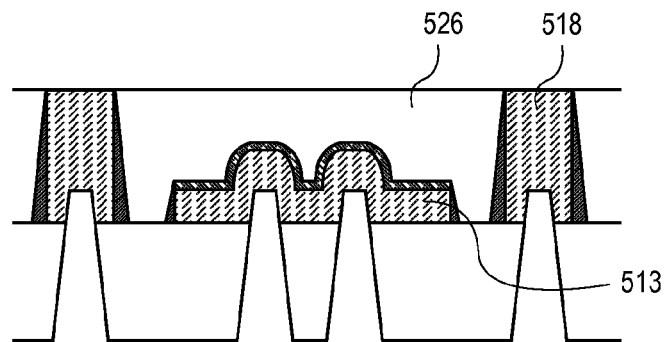
Figure 5H:
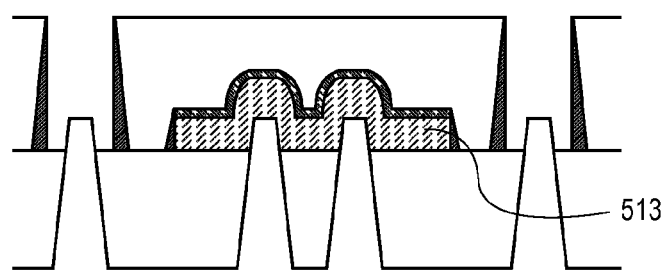
Figure 5I:
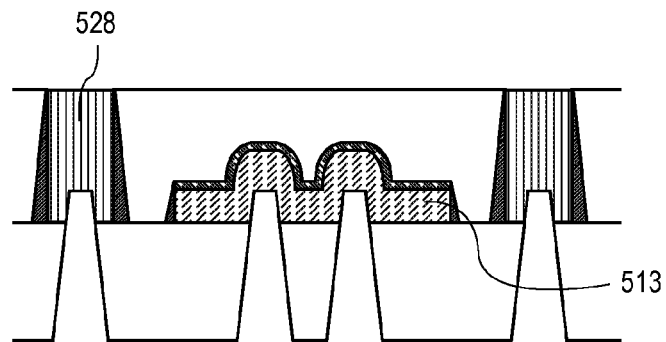
Figure 5J:
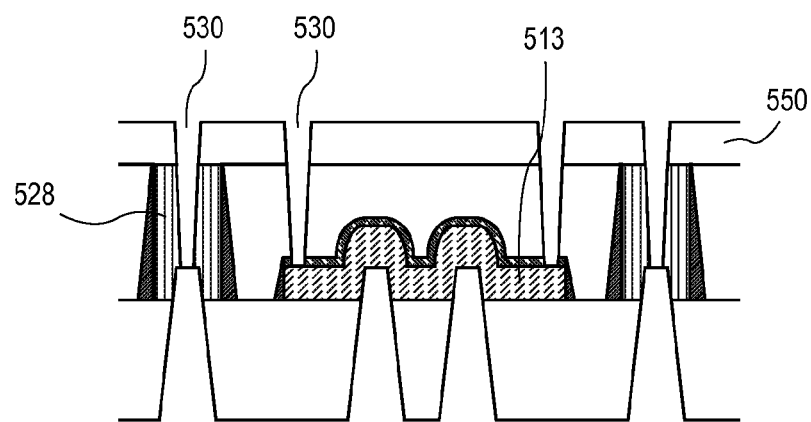
Figure 5K:
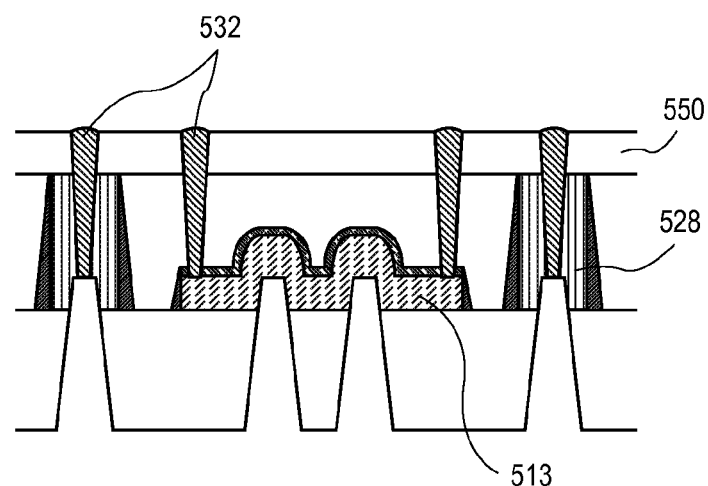

In a second non-planar fabrication approach, FIGS. 5A-5K illustrate cross-sectional views representing various operations in another method of fabricating a polycide fuse structure for a non-planar semiconductor device architecture, in accordance with an embodiment of the present invention. Referring to FIG. 5A, an isolation layer 502 is formed on a patterned bulk substrate 504 and recessed to leave a plurality of fins 506 exposed. A first layer of polysilicon 508 and a silicon nitride hardmask 510 is then formed conformal with the plurality of fins 506, as depicted in FIG. 5B. Although not depicted, an insulating layer may first be formed on fins 506 to ultimately insulate polysilicon layer 508 from the fin material. Referring to FIG. 5C, a patterning process, e.g., a lithography and etch process, of the silicon nitride hardmask 510 is performed to provide a polycide fuse mask 511. A second layer of polysilicon 514 is then formed above the polycide fuse mask 511. The second layer of polysilicon 514 is planarized, e.g., by a chemical mechanical polishing process, and a second hardmask layer 516 is formed thereon, as depicted in FIG. 5D. Referring to FIG. 5E, a patterning process, e.g., a lithography and etch process, of the first layer of polysilicon 508, the second layer of polysilicon 514, and the second hardmask 516 is performed to provide dummy gate structures 518, which may include spacers 520, and to provide polycide fuse precursor structure 512. The dummy gate structure 518 may then be masked by a mask 522, and hardmask 511 is removed from the polycide fuse precursor structure 512. Subsequently, a metal deposition/anneal or metal implant/anneal process is performed on the hardmask-free polycide fuse precursor structure 512 to provide a metal silicide layer 524. The resulting structure is a polycide fuse structure 513, as depicted in FIG. 5F. Referring to FIG. 5G, mask 522 is removed and an inter-layer dielectric layer 526 (e.g., silicon oxide) is formed over the dummy gate structures 518 and the polycide fuse structure 513. The inter-layer dielectric layer 526 is planarized to expose the polysilicon of the dummy gate structure 518, but to retain polycide fuse structure 513 as un-exposed. The polysilicon of the dummy gate structures 518 is then removed, but the polycide fuse structure 513 is retained, as depicted in FIG. 5H. Referring to FIG. 5I, permanent gate electrodes 528, e.g., metal gate electrodes (with, possibly, high-k gate dielectric layers), are formed. Additional inter-layer dielectric material 550 is formed and contact openings 530 are then formed to expose both the permanent gate electrodes 528 and the polycide fuse structure 513 for electrical connection, as depicted in FIG. 5J. Referring to FIG. 5K, contacts 532 are formed, e.g., by tungsten metal fill and polishing. The permanent gate structures 528 may be gate structures for a tri-gate device, while the structure 513 is a polycide fuse structure. The above approach may be referred to as a buried hardmask stacked polysilicon polycide fuse approach.

Figure 6A:
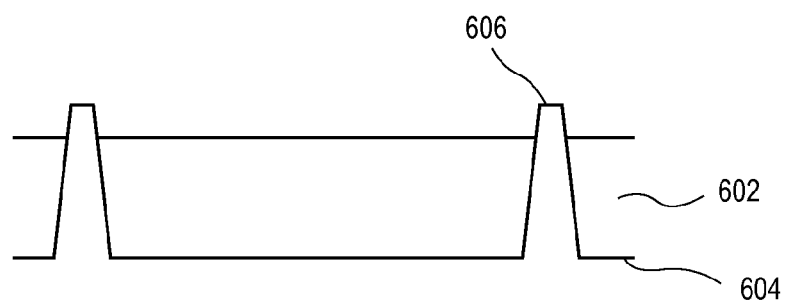
FIGS. 6A-6L illustrate cross-sectional views representing various operations in another method of fabricating a polycide fuse structure for a non-planar semiconductor device architecture, in accordance with an embodiment of the present invention.
Figure 6B:
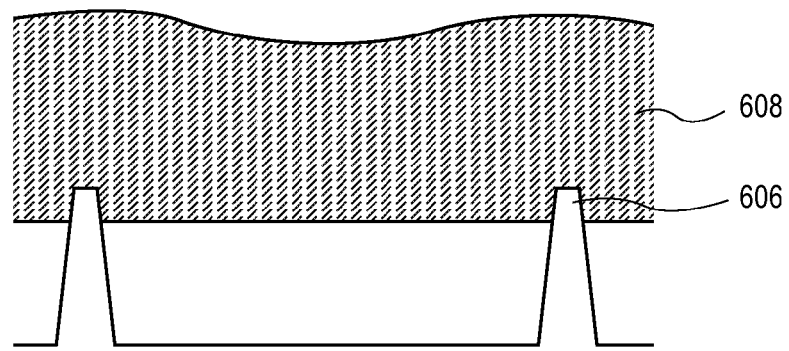
Figure 6C:
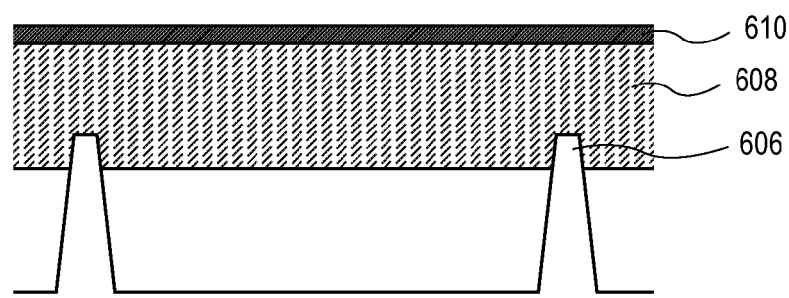
Figure 6D:
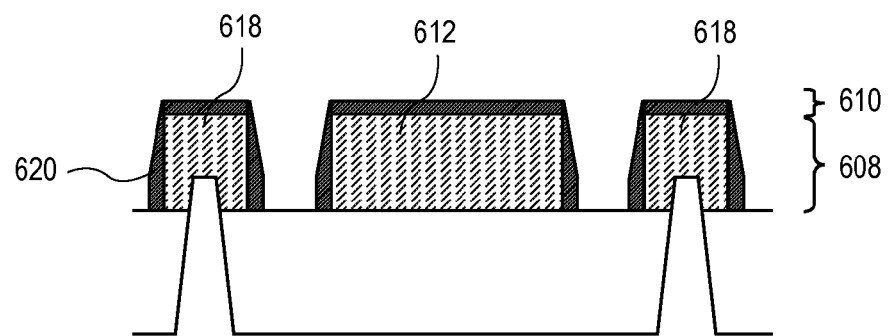
Figure 6E:
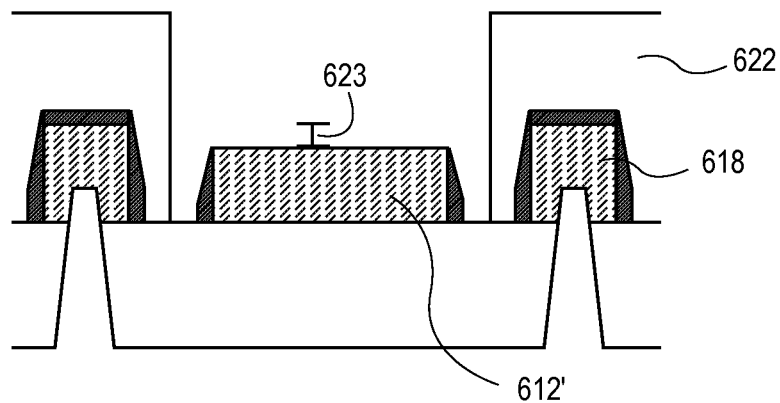
Figure 6F:
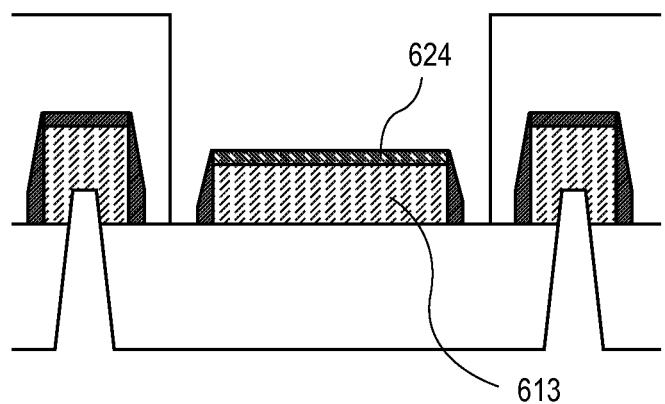
Figure 6G:
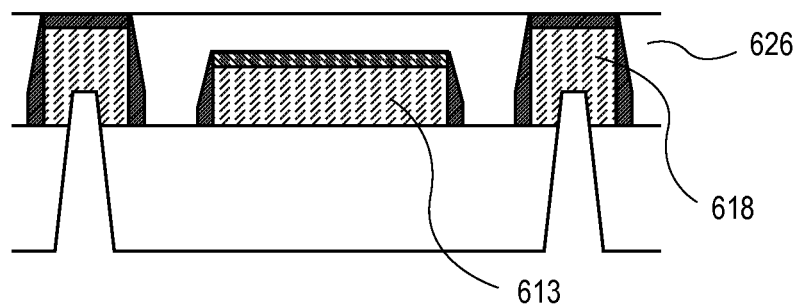
Figure 6H:
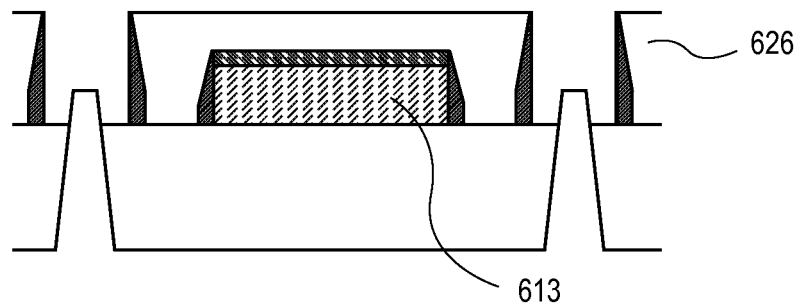
Figure 6I:
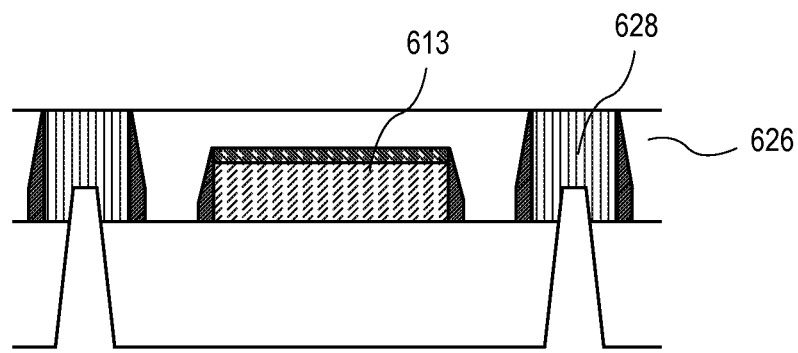
Figure 6J:
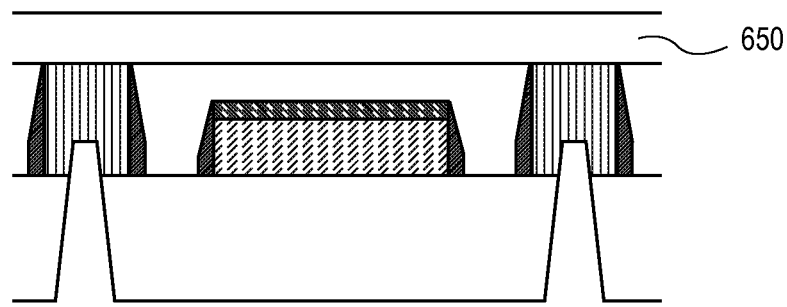
Figure 6K:
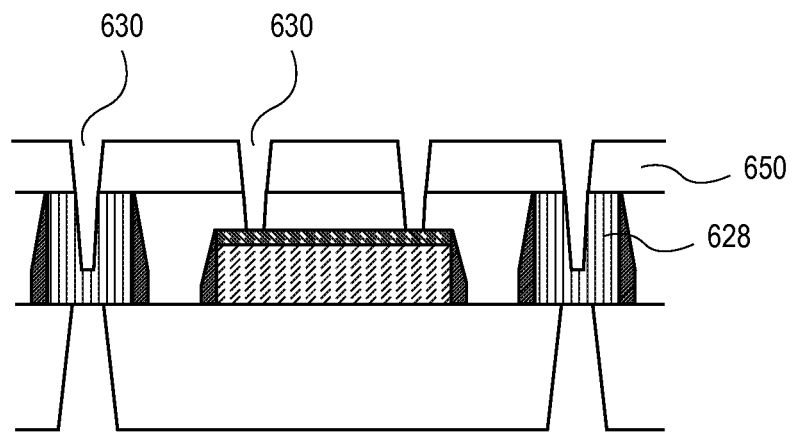
Figure 6L:
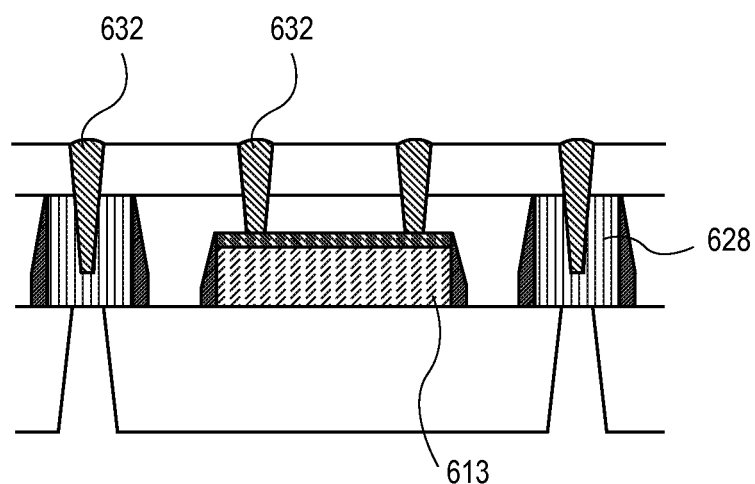

In a third non-planar fabrication approach, FIGS. 6A-6L illustrate cross-sectional views representing various operations in another method of fabricating a polycide fuse structure for a non-planar semiconductor device architecture, in accordance with an embodiment of the present invention. Referring to FIG. 6A, an isolation layer 602 is formed on a patterned bulk substrate 604 and recessed to leave a plurality of fins 606 exposed. A layer of polysilicon 608 is then formed above the fins 606, as depicted in FIG. 6B. Although not depicted, an insulating layer may first be formed on fins 606 to ultimately insulate polysilicon layer 608 from the fin material. Referring to FIG. 6C, the layer of polysilicon 608 is planarized, e.g., by a chemical mechanical planarization process, and a silicon nitride hardmask 610 is then formed. A patterning process, e.g., a lithography and etch process, of the silicon nitride hardmask 610 and the layer of polysilicon 608 is then performed to provide dummy gate structures 618 and a polycide fuse precursor structure 612, which may include spacers 620, as depicted in FIG. 6D. Referring to FIG. 6E, the dummy gate structure 618 may then be masked by mask 622. The exposed polycide fuse precursor structure 612 is then recessed, e.g., by an etch process. The recessing 623, in one embodiment, involves removal of the hardmask as well as a portion of the polysilicon layer to provide modified polycide fuse precursor structure 612'. Subsequently, a metal deposition/anneal or metal implant/anneal process is performed on the modified polycide fuse precursor structure 612' to provide a metal silicide layer 624. The resulting structure is a polycide fuse structure 613, as depicted in FIG. 6F. Referring to FIG. 6G, mask 622 is removed and an inter-layer dielectric layer 626 (e.g., silicon oxide) is formed over the dummy gate structures 618 and the polycide fuse structure 613. The inter-layer dielectric layer 626 is planarized to expose the polysilicon of the dummy gate structure 618, but to retain polycide fuse structure 613 as un-exposed. The polysilicon of the dummy gate structures 618 is then removed, but the polycide fuse structure 613 is retained, as depicted in FIG. 6H. Referring to FIG. 6I, permanent gate electrodes 628, e.g., metal gate electrodes (with, possibly, high-k gate dielectric layers), are formed. Additional inter-layer dielectric material 650 is then formed, as depicted in FIG. 6J. Referring to 6K, contact openings 630 are then formed to expose both the permanent gate electrodes 628 and the polycide fuse structure 613 for electrical connection. Contacts 632 are then formed, e.g., by tungsten metal fill and polishing, as depicted in FIG. 6L. The permanent gate structures 628 may be gate structures for a tri-gate device, while the structure 613 may be a polycide fuse structure. The above approach may be referred to as a recessed polysilicon polycide fuse approach.

Thus, one or more embodiments of the present invention address suitable properties of a polycide fuse structure. For example, in an embodiment, a polycide fuse structure described herein is compatible with current and future process technologies, e.g., the polycide fuse structure structures detailed are compatible with a trigate and/or high-k/ metal gate process flow where polysilicon of active devices is sacrificial and replaced with a metal gate architecture on a non-planar trigate process.

In the above described approaches, an exposed plurality of dummy gates may ultimately be replaced in a replacement gate process scheme. In such a scheme, dummy gate material such as polysilicon may be removed and replaced with permanent gate electrode material. In one such embodiment, a permanent gate dielectric layer is also formed in this process, as opposed to being carried through from earlier processing. In one embodiment, as described above, structures reserved for polycide fuses are blocked from removal of the polysilicon which is preserved for silicide formation.

In an embodiment, the plurality of dummy gates is removed by a dry etch or wet etch process. In one embodiment, the plurality of dummy gates is composed of polycrystalline silicon or amorphous silicon and is removed with a dry etch process comprising $SF_6$. In another embodiment, the plurality of dummy gates is composed of polycrystalline silicon or amorphous silicon and is removed with a wet etch process comprising aqueous $NH_4OH$ or tetramethylammonium hydroxide. In one embodiment, the plurality of dummy gates is composed of silicon nitride and is removed with a wet etch comprising aqueous phosphoric acid.

Perhaps more generally, one or more embodiments of the present invention may also be directed to a gate aligned contact process. Such a process may be implemented to form contact structures for semiconductor structure fabrication, e.g., for integrated circuit fabrication. In an embodiment, a contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly(gate) grid with separately patterning of contacts and contact plugs.

Figure 7:
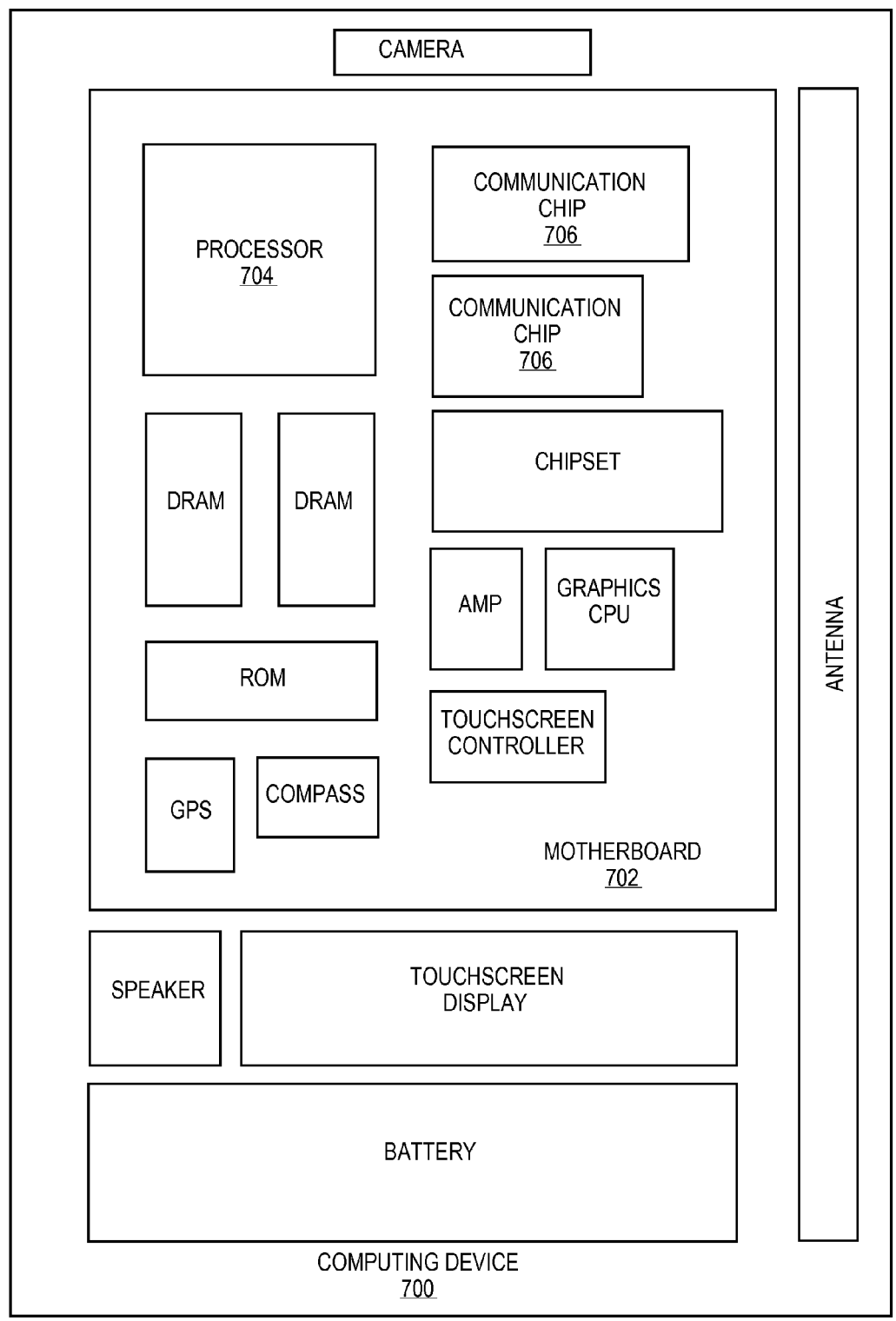
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more passive devices, such as polycide fuse structures built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more passive devices, such as polycide fuse structures built in accordance with implementations of the invention.

In further implementations, another component housed within the computing device 700 may contain an integrated circuit die that includes one or more passive devices, such as polycide fuse structures built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include CMOS-compatible polycide fuse structures and methods of fabricating CMOS-compatible polycide fuse structures.

In an embodiment, a semiconductor structure includes a substrate. A polycide fuse structure is disposed above the substrate and includes silicon and a metal. A metal oxide semiconductor (MOS) transistor structure is disposed above the substrate and includes a metal gate electrode.

In one embodiment, the polycide fuse structure is not programmed and is composed of a layer of metal silicide on a layer of polysilicon.

In one embodiment, the polycide fuse structure is programmed and is composed of a mixture of the silicon and the metal.

In one embodiment, the MOS transistor structure further includes a high-k gate dielectric layer.

In one embodiment, the high-k gate dielectric layer is disposed between the metal gate electrode and the substrate, and along sidewalls of the metal gate electrode.

In one embodiment, the metal of the polycide fuse structure is nickel or cobalt.

In one embodiment, the substrate is a bulk single crystalline silicon substrate, the MOS transistor structure is disposed on the bulk single crystalline silicon substrate, and the polycide fuse structure is disposed on an isolation region disposed in the bulk single crystalline silicon substrate.

In an embodiment, a semiconductor structure includes first and second semiconductor fins disposed above a substrate. A polycide fuse structure is disposed above the first semiconductor fin but not above the second semiconductor fin. The polycide fuse structure includes silicon and a metal. A metal oxide semiconductor (MOS) transistor structure is formed from the second semiconductor fin but not from the first semiconductor fin. The MOS transistor structure includes a metal gate electrode.

In one embodiment, the polycide fuse structure is not programmed and is composed of a layer of metal silicide on a layer of polysilicon.

In one embodiment, the polycide fuse structure is programmed and is composed of a mixture of the silicon and the metal.

In one embodiment, the MOS transistor structure further includes a high-k gate dielectric layer.

In one embodiment, the high-k gate dielectric layer is disposed between the metal gate electrode and the second semiconductor fin, and along sidewalls of the metal gate electrode.

In one embodiment, the metal of the polycide fuse structure is nickel or cobalt.

In one embodiment, the polycide fuse structure is disposed on an electrically insulating layer disposed on the first semiconductor fin.

In one embodiment, the first semiconductor fin is of a first plurality of semiconductor fins and the second semiconductor fin is of a second plurality of semiconductor fins. The polycide fuse structure is disposed above the first plurality of semiconductor fins but not above the second plurality of semiconductor fins. The MOS transistor structure is formed from the second plurality of semiconductor fins but not from the first plurality of semiconductor fins.

In one embodiment, the first and second pluralities of semiconductor fins are electrically coupled to an underlying bulk semiconductor substrate.

In one embodiment, the polycide fuse structure is a non-planar polycide fuse structure.

In an embodiment, a semiconductor structure includes first and second semiconductor fins disposed above a substrate. An isolation region is disposed above the substrate, between the first and second semiconductor fins, and at a height less than the first and second semiconductor fins. A polycide fuse structure is disposed above the isolation region but not above the first and second semiconductor fins. The polycide fuse structure includes silicon and a metal. First and second metal oxide semiconductor (MOS) transistor structures are formed from the first and second semiconductor fins, respectively. The MOS transistor structures each include a metal gate electrode.

In one embodiment, the polycide fuse structure is not programmed and is composed of a layer of metal silicide on a layer of polysilicon.

In one embodiment, the polycide fuse structure is programmed and is composed of a mixture of the silicon and the metal.

In one embodiment, each of the first and second the MOS transistor structures further include a high-k gate dielectric layer, and the high-k gate dielectric layer is disposed between the metal gate electrode and the respective first or second semiconductor fin, and along sidewalls of the metal gate electrode.

In one embodiment, the metal of the polycide fuse structure is nickel or cobalt.

In one embodiment, the first semiconductor fin is of a first plurality of semiconductor fins and the second semiconductor fin is of a second plurality of semiconductor fins. The first MOS transistor structure is formed from the first plurality of semiconductor fins and the second MOS transistor structure is formed from the second plurality of semiconductor fins. The first and second pluralities of semiconductor fins are electrically coupled to an underlying bulk semiconductor substrate.

In one embodiment, the polycide fuse structure is a planar polycide fuse structure.

In one embodiment, the polycide fuse structure has an uppermost surface at a height less than the heights of the first and second semiconductor fins.

What is claimed is:

1. A semiconductor structure, comprising:
   first and second semiconductor fins disposed above a substrate;
   an isolation region disposed above the substrate, between the first and second semiconductor fins, and at a height less than the first and second semiconductor fins;
   a polycide fuse structure disposed above the isolation region but not above the first and second semiconductor fins, the polycide fuse structure comprising silicon and a metal; wherein the metal of the polycide fuse structure is nickel or cobalt; and
   first and second metal oxide semiconductor (MOS) transistor structures formed from the first and second semiconductor fins, respectively, the MOS transistor structures each comprising a metal gate electrode,
   wherein each of the first and second MOS transistor structures further comprises a high-k gate dielectric layer, wherein the high-k gate dielectric layer is disposed between the metal gate electrode and the respective first or second semiconductor fin, and along sidewalls of the metal gate electrode,
   wherein a bottom surface of the high-k gate dielectric contacting the isolation region is coplanar with a bottom surface of the polycide fuse structure, and wherein an upper surface of the polycide fuse structure is below an upper surface of the metal gate electrode,
   wherein the first semiconductor fin is of a first plurality of semiconductor fins and the second semiconductor fin is of a second plurality of semiconductor fins, wherein the first MOS transistor structure is formed from the first plurality of semiconductor fins and the second MOS transistor structure is formed from the second plurality of semiconductor fins, and wherein the first and second pluralities of semiconductor fins are electrically coupled to an underlying bulk semiconductor substrate.

2. The semiconductor structure of claim 1, wherein the polycide fuse structure is not programmed and comprises a layer of metal silicide on a layer of polysilicon.

3. The semiconductor structure of claim 1, wherein the polycide fuse structure is programmed and comprises a mixture of the silicon and the metal.

4. The semiconductor structure of claim 1, wherein the polycide fuse structure is a planar polycide fuse structure.

5. A semiconductor structure, comprising:
   first and second semiconductor fins disposed above a substrate;
   a polycide fuse structure disposed over the first semiconductor fin but not over the second semiconductor fin, the polycide fuse structure comprising silicon and a metal; and
   a metal oxide semiconductor (MOS) transistor structure formed from the second semiconductor fin but not from the first semiconductor fin, the MOS transistor structure comprising a metal gate electrode,
   wherein the first semiconductor fin is of a first plurality of semiconductor fins and the second semiconductor fin is of a second plurality of semiconductor fins, wherein the polycide fuse structure is disposed above the first plurality of semiconductor fins but not above the second plurality of semiconductor fins, and wherein the MOS transistor structure is formed from the second plurality of semiconductor fins but not from the first plurality of semiconductor fins.

6. The semiconductor structure of claim 5, wherein the first and second pluralities of semiconductor fins are electrically coupled to an underlying bulk semiconductor substrate.

* * * * *